United States Patent [19]

Gove

[11] 4,163,222

[45] Jul. 31, 1979

[54] SYNCHRONOUS PHASE DETECTED KEYBOARD

[75] Inventor: Donald C. Gove, Manchester, Mass.

[73] Assignee: Amkey, Incorporated, Andover, Mass.

[21] Appl. No.: 837,653

[22] Filed: Sep. 29, 1977

Related U.S. Application Data

[63] Continuation of Ser. No. 662,195, Feb. 27, 1976, abandoned.

[51] Int. Cl.² .............................................. G06F 3/02
[52] U.S. Cl. .......................... 340/365 S; 200/DIG. 1; 340/365 L; 400/479.1
[58] Field of Search ............ 340/365 C, 365 S, 365 L, 340/365 R; 197/98; 179/90 K; 323/93; 200/5 A, DIG. 1; 84/DIG. 7; 361/276; 400/479.1

[56] References Cited

U.S. PATENT DOCUMENTS

| | | | |
|---|---|---|---|
| 3,623,082 | 11/1971 | Stein et al. ......................... | 340/365 S |
| 3,696,908 | 10/1972 | Gluck et al. ....................... | 340/365 C |
| 3,797,630 | 3/1974 | Zilkha ................................ | 340/365 C |
| 3,931,610 | 1/1976 | Marin et al. ....................... | 340/365 C |

*Primary Examiner*—John W. Caldwell, Sr.
*Assistant Examiner*—James J. Groody
*Attorney, Agent, or Firm*—James J. Cannon, Jr.

[57] ABSTRACT

For capacitance coupled keyboard data entry means, a key switch, synchronous circuitry and phase detector in combination to yield a unique encoder output signal for a keyboard matrix. Capacitance coupling is effected prior to full key switch travel, that is, coupling actuation prior to full key downtravel and deactuation subsequent to manual key switch release, said key switch having a floating electrical coupling plate inhibited from dropping to a printed circuit board by a fixably positioned magnet. Coupling actuation providing mechanical hysterisis is effected upon key depression by a spring forcing said plate from the magnet and deactuation is effected by the magnet retracting said plate. An analog multiplexer, in synchronization with an encoder are driven by clock counter means to scan the keyboard matrix. The counter further provides distinct high frequency pulse bursts to an actuated coupled connection. High frequency analog multiplexed key switch signals are amplified and transferred upon a single line string having a phase detector in synchronization with the system. The phase detector compares an actuated key reference signal phase to the phase of an actuated key multiplexed signal filtering the latter, the reference phase being derived from said high frequency pulse bursts fed an actuated coupled key switch connection.

5 Claims, 7 Drawing Figures

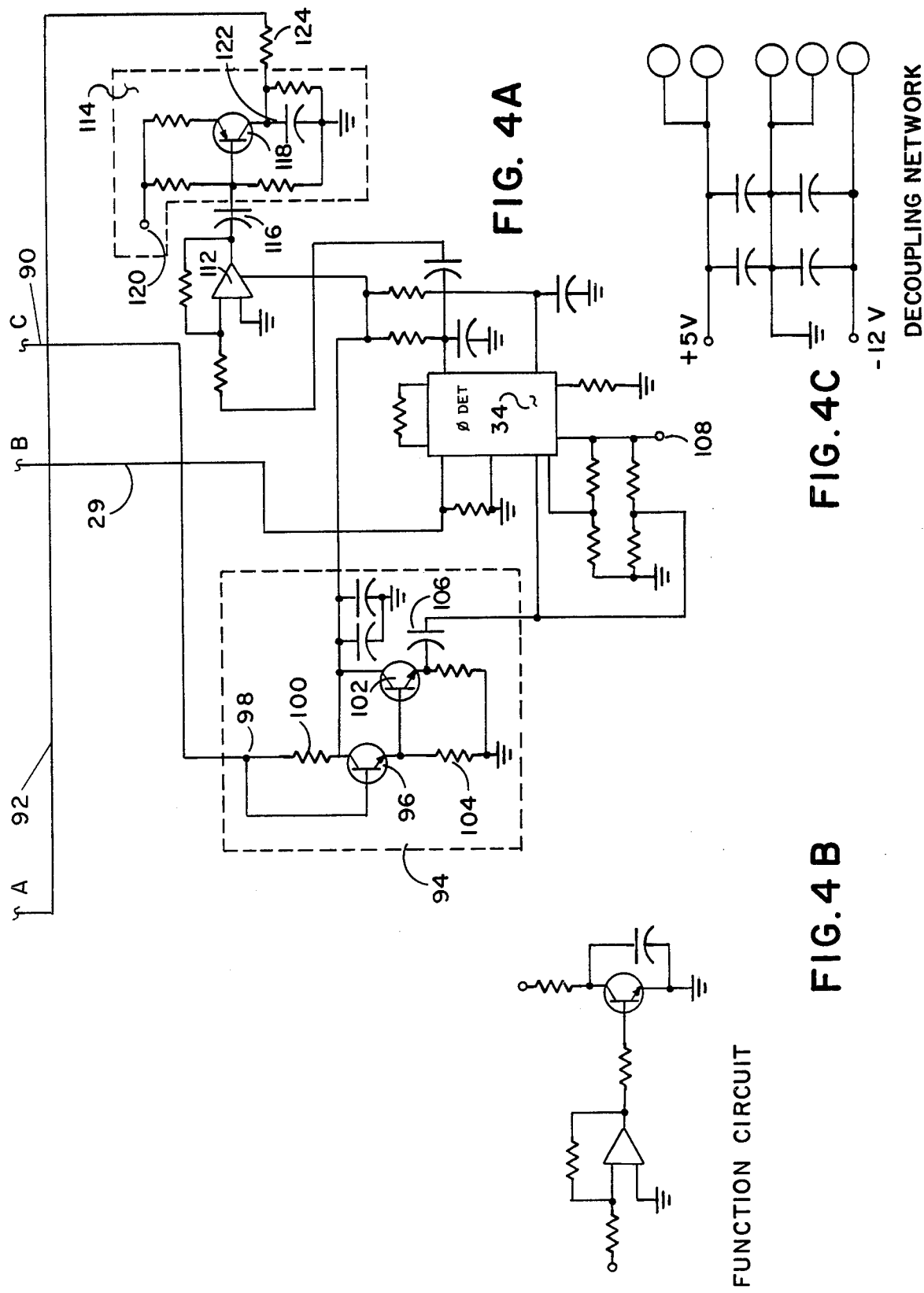

SYNCHRONOUS PHASE DETECTED KEYBOARD

This is a continuation of application Ser. No. 662,195 filed Feb. 27, 1976, now abandoned.

FIELD OF THE INVENTION

This invention relates to electronic switching apparatus and, particularly, to a capacitance coupled selector switch matrix employing an array of noncontacting switching points effecting mechanical hysterisis, each giving rise to a unique corresponding characteristic output signal encoding pattern when actuated. This novel switching matrix is particularly adapted to a multiple key keyboard.

DESCRIPTION OF THE PRIOR ART

Capacitance coupled keyboards for use with digital data entry and control systems to effect direct electrical data and control connections have been utilized for some time. Prior patents of the present inventor pertaining to the switching apparatus used therein are U.S. Pat. Nos. 3,419,697, and 3,660,838. A recent patent in the art and pertinent to the present application is Cencel, U.S. Pat. No. 3,375,113. Although capacitance coupled keyboards have been known for some time, they have gained mass acceptance only recently with most advancements in the field being made in the last two years.

Primarily, the improvements disclosed by the present application relate to problems within the art, namely the design of the input key, its related electrical coupling connection, and the design of the circuitry which transfers information from the keyboard to a data output means. The Cencel patent noted the problems associated with the art and made improvements relating to the response and sensitivity of an actuated key switch through the use of an improved capacitance coupled connection and related electronic hysterisis circuitry which permitted the use of sense amplifiers only upon the y-columns prior to entry into a multiplexer. Prior to Cencel, inadequacy of the initial key switch coupled signal required transistors, resistors, oscillators, capacitors, and amplifiers properly shielded upon the circuit board to effect a distinct and distinguishable capacitance coupled connection; thus, if a shielded element would malfunction, the repair was time consuming and expensive.

In contrast, the present invention utilizes an unshielded, except for integral etch shielding, circuit board which itself receives input pulses upon one receiving plate and outputs signals from a second plate after capacitance coupling without the need of further hardware. Specifically, the key and related improved circuitry have been designed to improve prior art performance of a capacitively coupled key switch coupling plate connection to provide a more distinguishable signal having minimal interfering and confusing noise while reducing the number of components necessary to reliably introduce information into a system. This is accomplished through the use of a key switch, which provides mechanical hysterisis eliminating the need for electronic hysterisis, and through the use of a phase detector, relying upon an input pulse reference phase, to discriminate the output pulse phase of an analog multiplexer to be certain the output pulse is in phase with the reference, eliminating the need of sense amplifiers, transistors and resistors per key.

Another problem solved by the present invention is contact switch wear and bounce which will yield deceptive signals. A major consideration is also insulation from the operator of electrical current associated with the contact switch, as in the present invention, the input pulse is applied directly to a receiving plate upon the printed circuit board at a low voltage level. Furthermore, simplification of the key switch and substitution of a portion of the complex circuitry used to transfer the information represent a substantial cost reduction for manufacturing the entire apparatus as well as a significant improvement of the overall reliability of the apparatus.

SUMMARY OF THE INVENTION

The present invention centers primarily around an improved multiplexer output to encoder circuit utilizing a synchronous phase detector and an improved key switch including an electrically floating linear motion coupling plate, in combination with a fixably positioned magnet inhibiting downward movement of the plate, to effect capacitance coupling with receiving, active electrically conducting plates fixably positioned upon an unshielded printed circuit board. The free floating coupling plate design of the present invention produces a mechanical hysterisis effect, provides tactile feel similar to an electric typewriter, shields the operator from electric current, allows a printed circuit board to be used without extraneous shielding, and allows a novel arrangement of circuitry for the transference of electrical data from an external analog multiplexer.

To achieve maximum efficiency of the key of the present invention and to increase distinct signal performance of the system as a whole over the prior art, the present invention employs a clock counter means to drive an analog multiplexer capable of receiving a capacitively coupled signal from the keyboard matrix y-output column lines. A synchronous circuit maintains the analog multiplexer in synchronization with a digital encoding means. The encoding means receives only one line from the multiplexer for information corresponding to the plurality of key-board matrix y-column lines; thus the encoder digital multiplexer is shorted out as its function is replaced by the analog multiplexer, the information going directly to the encoding means read-only-memory which is perceiving the same y-column line as is the analog multiplexer. The clock-counter means scans for capacitively coupled connections and sends out a specific number of distinct high frequency pulses, thirty-two as embodied in the present invention, rather than a single pulse as is common as the art. Upon a capacitive coupling, the pulses emanate through the x-line coordinate and the coupled connection to the y-line coordinate. Due to key switch mechanical hysterisis and due to the unique coupling design, that is, by driving the free-floating plate itself, independent of full key switch travel, a strong distinct electrical connection and signal results, having reduced noise which may be easily distinguished by the multiplexer without amplification. Therefore, since the initial multiplexer signal is distinct, unique and relatively free of noise because of its frequency, the information output may be transferred upon a single line string having a phase detector and simple current amplification means.

The synchronous phase detector further reduces the susceptibility of the keyboard to noise to a minimum and acts as an "high Q" filter, recognizing only those signals which are in phase with a reference phase, the reference phase being transmitted from the same keyboard matrix block from which the x-row pulses were derived. The phase detector provides excellent signal to noise ratios and developes a distinctive output voltage at a DC level which is effectively a single signal as perceived by encoder read-only-memory.

It should be noted that the circuitry used to transfer the information of a capacitance coupled connection could be contained in the same integrated circuit package as the encoder. Also standard integrated circuits could be substituted for the somewhat specialized keyboard encoder as embodied with the present invention.

It is therefore an object of the present invention to provide an improved switching apparatus which effects mechanical hysterisis without extraneous hardware and shielding through the use of a linear motion floating coupling plate.

It is also an object to provide information transference circuitry of a simplified single string nature which can discriminate and filter capacitance coupled signals through the use of a phase detector.

In conjunction with the above objects it is possible to construct an improved multiple switching point keyboard upon a standard design double sided printed circuit board relatively simply and inexpensively and to maintain easy access to malfunctioning components while improving the reliability of the system as a whole.

The following drawings and description thereof will further illustrate the advantages of the unique key design and the novel circuitry of the present invention.

BRIEF DESCRIPTION OF THE DRAWINGS

FIGS. 4 and 4A are a schematic diagram depicting the relevant circuitry of a multiple switch keyboard, the circuitry illustrated especially with reference to a single string amplifier and synchronous phase detector circuit as illustrated schematically in FIG. 1.

FIGS. 4B and 4C are schematic diagrams of the function circuit and the decoupling network respectively.

DESCRIPTION OF THE PREFERRED EMBODIMENT

Figure 1:
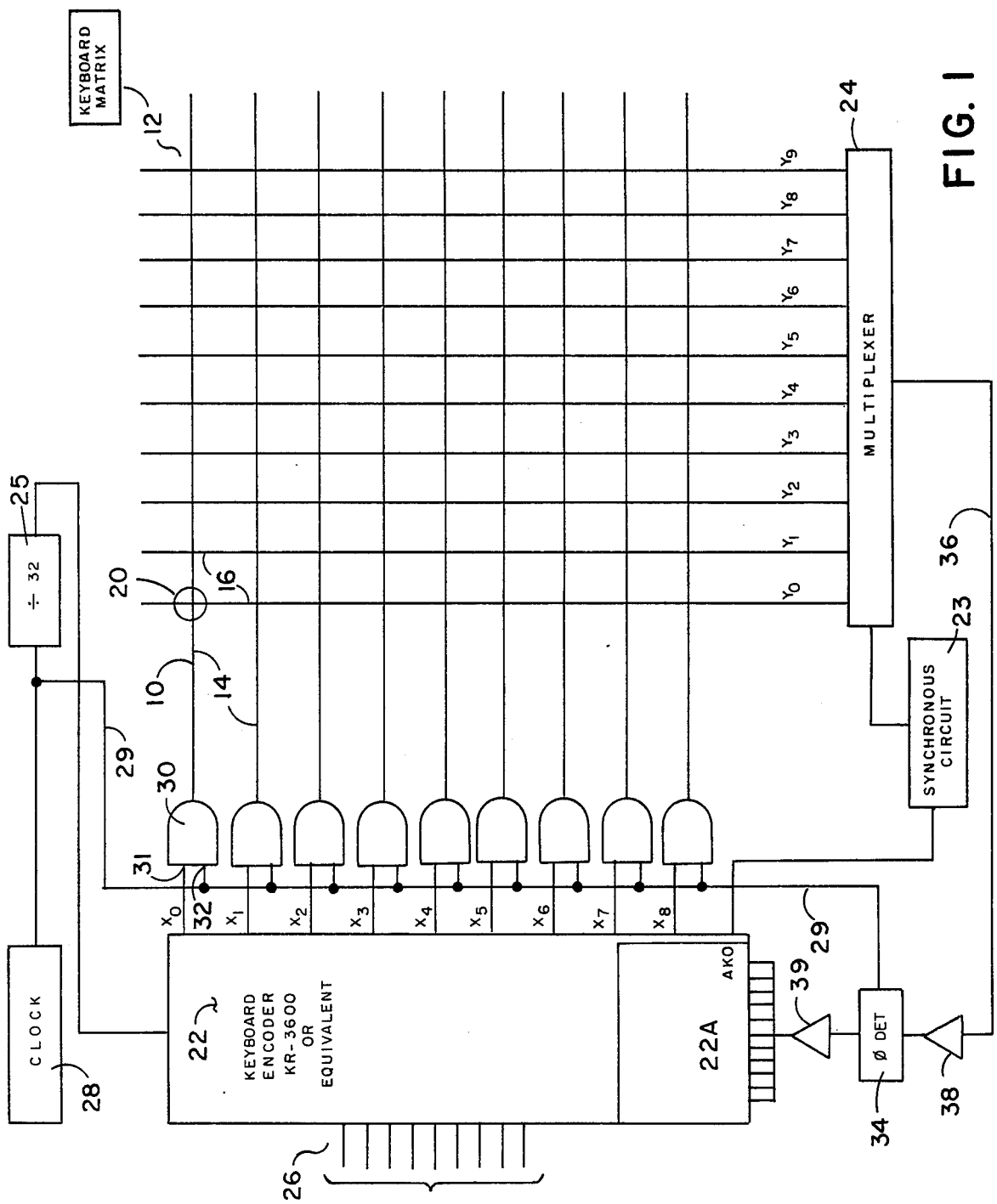
FIG. 1 depicts a general schematic block diagram of the multiple switch keyboard illustrating the circuitry and principles of the present invention.

Referring now to FIG. 1, an idealized block diagram depicting the combination of circuitry and the principles of operation of the keyboard system of the present invention is illustrated. It should be noted at this point that the circuitry as diagramed, when embodied in combination with the key switch illustrated in and described in conjunction with FIGS. 2 and 3, needs no electronic hysterisis circuitry to increase the sensitivity of an actuated key; however, the circuitry of FIG. 1 may be utilized with existing key switches if electronic hysterisis circuitry is provided, but, as compared to the combination of the present invention, such a system would be more complicated, less reliable and have an attendant higher cost.

Keyboard 10 is portrayed as a nine-by-ten matrix 12 of nine rows 14 and ten intersecting columns 16, designated "x" and "y" respectively. Although the matrix embodiment illustrated will thus employ ninety operative key-switches 20 of FIGS. 2 and 3 at the x and y coordinate intersections, the invention should not be limited to this number. Each x-row 14 is therefore capable of activating ten key-switches 20 while each y-column 16 accommodated nine key-switches 20.

Keyboard encoder 22 addresses the nine x-rows 14 of matrix 12 and receives analog signals from multiplexer 24 which directly addreses the y-columns 16 of matrix 12. The keyboard encoder presently utilized is a Standard Microsystems $KR_{3600}$ having a ten bit read only memory, a shift register and necessary logic for "n" key rollover. Encoder 22 is capable of providing signals to the keyboard x-rows 14 of the keyboard matrix configuration of the present invention. Integrated circuits other than the particular above mentioned encoder may be embodied with the invention hereinafter described.

As embodied, encoder 22 has the y-column digital multiplexer shorted out thus allowing signals from multiplexer 24 to pass through the standard internal digital encoder multiplexer and to be received by the read-only-memory 22A. Encoder 22 further has information output stage 26. Thus each y-column 16 can be capacitively coupled to an x-row 14 by the actuation of keyswitch 20 which will yield a distinctive signal to be transferred to output stage 26 of encoder 22. Clock counter means 28 drives encoder 22 through a divide-by-thirty-two clock 25 and pulses x-rows 14 through AND gates 30, line connection 31.

Clock 28 also drives multiplexer 24, which includes a "divide by ten clock," in synchronization with encoder 22 read-only memory 22A; through synchronous circuit 23. Furthermore clock 28 provides on line 29, high frequency pulses to matrix 12 through a separate line connection 32 of AND gate 30, the pulses in effect scanning matrix 12 and providing a reference signal for phase detector 34. Each time encoder 22 provides an x-row key switch signal, the base for the reference signal, as embodied, thirty-two high frequency pulses are passed through the capacitance coupled connection to be distinguished on the appropriate y-columns by analog multiplexer 24. The analog signal is thereby transferred on single line string circuit 36 to synchronized encoder read-only-memory 22A which is scanning as if it were receiving all y-lines rather than simply a single y-line.

The multiplexer output signal passes through current amplifier 38 which simply amplifies the current, the increased signal being picked up by synchronous phase detector 34 which acts as an "high Q" filter to reduce the susceptibility of the keyboard to noise and false signals. Phase detector 34 is in synchronization with the system as it has comparator terminals which receive high frequency pulses through reference line 29 as a reference phase. Phase detector 34 recognizes only high frequency signals from multiplexer 24 output which are in phase with the reference phase. The reference phase is initially derived from the same coordinate block from which encoder x-row 14 pulses are derived. When the signals are in phase a distinctive output voltage at a pulse level then travels on single line string circuit to thresholding amplifier 39 and thereafter to the read-only-memory 22A of encoder 22. Thresholding amplifier 39 may be utilized to further discriminate false signals, especially noise and weak signals, by adjusting the minimum threshold signal level.

Figure 2:
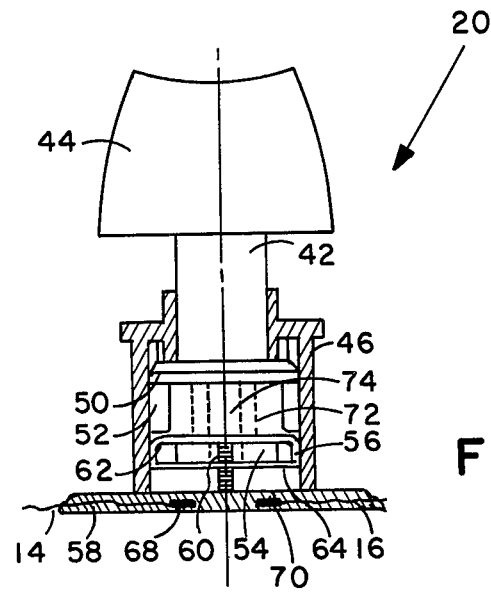
FIG. 2 is a cross-sectional view of the variable capacitance key-switch structure of the present invention in normal position.
Figure 3:
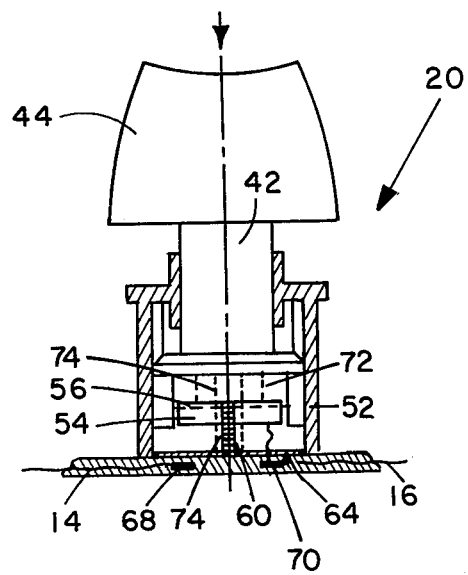
FIG. 3 illustrates the variable capacitance key of FIG. 2 at its actuation point with a standard printed circuit board configuration and further illustrates by phantom lines, the overtravel of the key of FIG. 1.

The novel capacitance key switch 20 of the present invention is illustrated in detail in FIGS. 2 and 3. The basic structure of key switch 20 is comprised of inner shaft 42, attached to an appropriate key cap 44, and an outer housing guide member 46 all of which may be made from any suitable material but preferably from an insulating plastic. Shaft 42 is characterized by an upper cylindrical portion which is integrated with a platform base 50, base 50 further having downward extending legs 52 from each of its four corners. To prevent lateral movement of shaft 42, platform base 50 and guide legs 52 slidably communicate with housing guide 46, with shaft cylindrical portion being encompassed by and slidable within the upper extent of housing guide 46. Guide 46 further defines the upper extent of shaft 42 up-travel.

A magnet 54 is fixably secured to the underside of support plate 56 both being displaced mediately within housing guide 46 at a relatively large distance from printed circuit board 58. Support plate 56 is snugly fitted within housing guide 46 and is supported on two sides by relatively thin downward protruding legs 60 which rest on an insulated portion of printed circuit board 58, while the adjacent sides of plate 56, in communication with housing guide 46, are biased or turned downwards to form a type of inverted U shape to give further support to plate 56; however, the biased sides do not extend to printed circuit board 58 but are of a length slightly less than the thickness of magnet 54. Magnet 54 is preferably of a rectangular shape as compared to the squareness of support plate 56, whereby the ends of magnet 54 communicate with support legs 60 while the sides of magnet 54 are substantially displaced from the biased sides of support plate 56 as support plate 56 extends beyond the width of magnet 54. Plate 56 further has squared apertured corners 62 thereby forming an inner guide for shaft legs 52 during shaft down-and up-travel.

Coupling plate 64, its apertured sides being coincidental with support plate legs 60, is inhibited from dropping upon circuit board 58 by magnet 54 and may be classified as an electrically free floating member. The design of coupling plate 64 is dependent upon the necessity of key shaft legs 52, protruding through apertured plate corners 62 during shaft down-travel, being capable of communication with the outer extent of each lateral end of coupling plate 64. Thus the lateral ends of coupling plate 64 will contact circuit board 58 which is comprised of an outer covering of Kapton or similar dielectric, and two distinct plates 68 and 70, one plate corresponding and receiving x-row line pulses and one plate corresponding to y-column line pulses.

Further embodied in key switch 20 are two springs 72 and 74. Outer concentric spring 72 is in communication with the lower surface of rectangular platform shaft base 50 and the upper surface of magnet support plate 56. Spring 72 acts primarily to yield the desired or required "touch" of key-top cap 44 and to provide the vertical upward bias of key switch 20. Inner spring 74 is in communication with the lower surface of rectangular platform key base 50 and extends through a centrally disposed annular bore in both magnet support plate 56 and magnet 54 thus communicating with the upper surface of coupling plate 64.

Referring now to FIG. 3, the actuation point of key switch 20, the operative interrelations of the components previously described are further illustrated.

Initially spring 72 is partially compressed while spring 74 is usually under no tension of significance. FIG. 3 illustrates the depression of key switch 20 at a position mediate to full shaft travel whereby shaft legs 52 engage coupling plate 64 and platform base 50 compresses springs 72 and 74. The magnetic bond inhibiting coupling plate 64 from dropping onto circuit board 58 is broken by the engagement of shaft legs 52 upon coupling plate 64 rather than by the force of spring 74 thereby providing that the actuation point for all keys will be identical. Coupling plate 64, forced from magnet 54, drops to circuit board 58 and is pushed by spring 74 securely against the appropriate receiving plate circuitry prior to full shaft down-travel. Prior to this actuation point, therefore, the strength of spring 74, while being compressed in conjunction with spring 72, is not enough to break the magnetic bond retaining coupling plate 64. This feature aids in preventing an inadvertant key depression from making a capacitive coupled connection.

Shown by phantom lines is the overtravel of shaft 42 which itself has no significant effect upon the electrical connection of coupling plate 64 upon the circuit board, although both springs are further compressed.

The apparent switch point of switch 20 is higher than the actual switch point as a keyboard operator will sense when shaft downtravel has broken the magnetic bond since further key depression will require less force. Shaft 42, however, will continue its travel to a point of ultimate compression of spring 72 which, in essence is a point near the upper surface of magnet support plate 56, the travel being stopped ultimately by guide legs 60 to prevent contact wear. This action and the strength of spring 72 will depend upon the desired "touch" of the key-top cap.

FIG. 3 may be further referred to for illustration of the release point of coupling plate 64, that point being significantly different from the actuation point. As keycap 44 and shaft 42 begin their upward movement due to the action primarily of spring 72 returning shaft 42, spring 74 expands and reduces pressure on coupling plate 64 until attractive magnetic force is sufficient to cause coupling plate 64 to snap back to magnet 54 and assume the position as illustrated in FIG. 2; however, due to the fact that a magnetic gap exists in the distance between coupling plate 64 and magnet 54 with plate 64 in the coupled position, the attractive force of magnet 54 is reduced, as compared to its strength at actuation, shaft 42 must travel to a point above that of the actuation point allowing spring 74 to expand before the coupling plate 64 can snap back. The mechanical hysterisis necessary to the above embodied circuitry of FIG. 1 is effected by key switch 20 thereby assuring that one and only one character registers as being capacitively coupled and making the keyboard "tease proof" due to the length in time in coupling and the secure connection made.

It should be noted that key switch 20 could, for some specialized applications where specific tactile feel of the key is not an essential parameter, be embodied without springs 72 and 74 whereby return would be effected by the magnet without any restraint upon the upward movement of coupling plate 64. The effective hysterisis would be accomplished by the finger of the operator. Also for other applications only outer spring 72 may be embodied in key switch 20 thus providing the desired "touch," the touch being provided by the strength of spring 72 and the strength of the magnetic bond as above described.

The configuration of key switch 20 and particularly the incorporation of free-floating coupling plate 64 allows simple and efficient manufacture and related cost savings. Due to the fact that coupling occurs prior to full depression and continues after release, a more efficient and dependable contact is obtained and further acts as a mechanical hysterisis. It also should be noted that neither shaft 42 nor coupling plate 64 initially receive any electrical input. The electrical input is received only by the relevant circuit board circuitry, that is, receiving plate 68, thus effectively reducing to a minimum the chance of electric shock when operating a particular key. Since there are no active components beneath the circuit board, as is common to most keyboards, repair of a malfunctioning element is easily effected. Furthermore the floating coupling plate 64 may allow full coupling even if the shaft is at an angle not perpendicular to the PC board. Further advantages of the embodiment of key switch 20 will be apparent from the following discussion of the novel circuitry for transference of the depressed key capacitance change signal to an encoder yielding data output.

Figure 4:
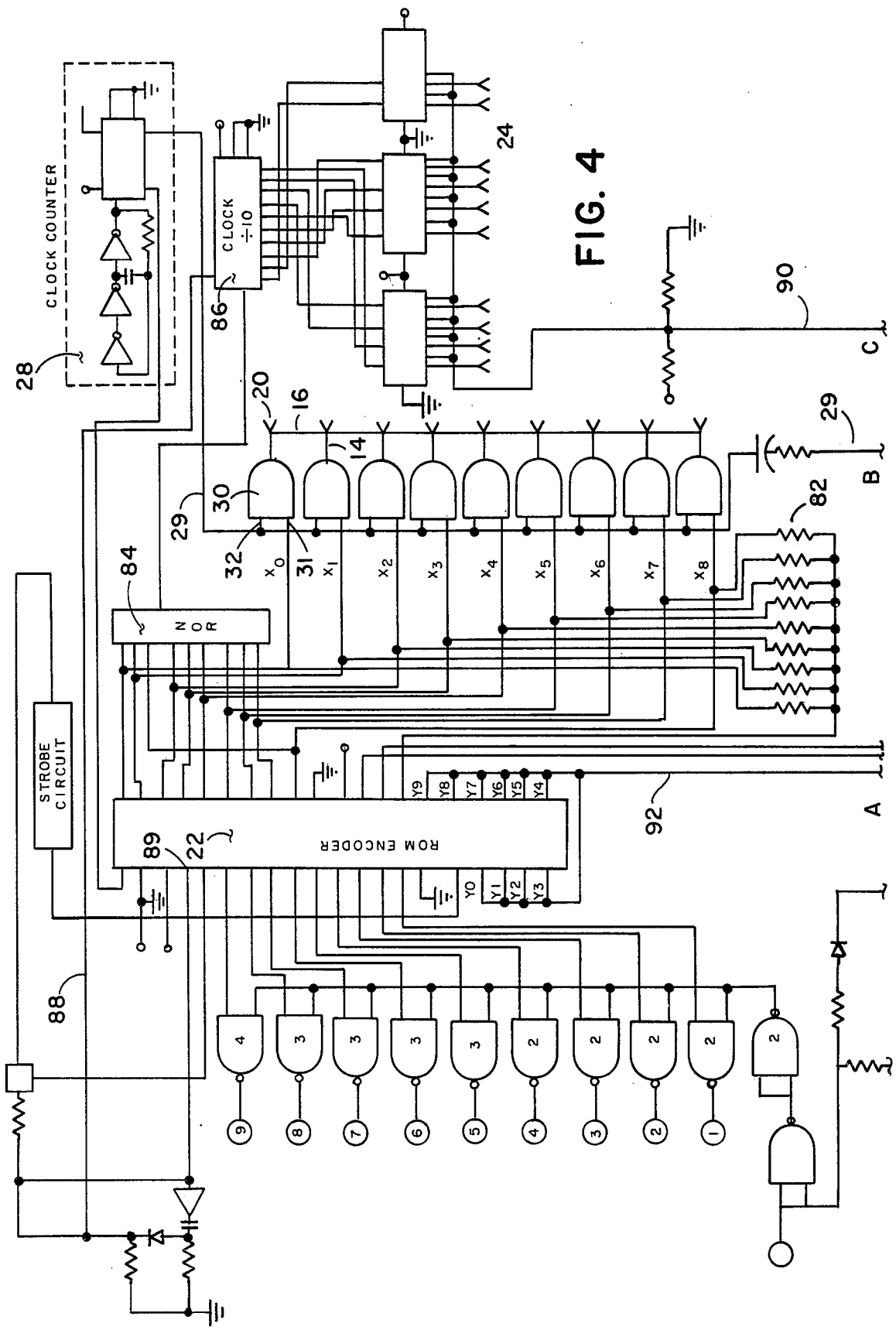

The circuitry comprising FIG. 4 is illustrative of the actual embodiment of the principles as disclosed with reference to FIG. 1. Internal clock counter 28 drives encoder 22 which sends single pulses to x-row lines 14 through and gate x-line connection 31. The single pulses are gated with high frequency pulses, derived from clock 28, through line 29 gate connection 32, which scan x-row lines 14 for a capacitive coupled connection. As embodied thirty-two pulses are used and are fed through reference line 29 to AND gate connection 32. Reference line 29 is further connected to synchronous phase detector 34. All x-row lines 14 are individually tied to resistors 82 which reduce noise within the system.

Encoder 22 also drives multiplexer 24 through a nine input NOR gate 84. Each time an x-line 14 goes high, this circuitry clocks the multiplexer divide by ten counter 86 which is set at the same scanning rate as that of internal encoder read-only-memory 22A. The scanning synchronization of encoder read-only-memory 22A and multiplexer 24 is effected through a reset circuit 88 from encoder terminal 89, through the use of any-key-down pulse, as registered by encoder 22 due to a coupled connection. Upon detection of an initial coupled connection, the scanning clock counters are reset to $x_0$, $y_0$ to synchronize the scanning of multiplexer 24 with that of encoder read-only-memory 22A. As previously mentioned, encoder read-only-memory 22A is scanning and acts as if it were receiving the individual lines from multiplexer 24 and, when in operation, this scanning is identical to that of multiplexer 24. Thus, the read-only-memory 22A will be in a scanning position to receive the appropriate line multiplexer output analog signal as if it were receiving that signal on individual y-lines as it is perceiving the y-lines one at a time in the same manner that multiplexer 24 perceives the actual y-columns 16 of the keyboard.

When the keyboard unit is first turned on, multiplexer 24 and encoder 22A begin scanning arbitrarily. The first time an any-key-down pulse is effected, synchronization of scanning will occur. To provide automatic synchronization, a capacitor could be used which would simulate a key pulse when the key-board is turned on and, therefore, multiplexer and encoder scanning would automatically be synchronized.

Upon effective capacitance coupling of a key-switch 20, encoder clock-counter 28 feeds the high frequency pulse bursts through gated connection 32, whereby multiplexer 24, scanning y-column lines 16, picks up the distinctive high frequency signal. The analog signal is then transferred upon single line string 90 to current gain amplifier 94 which only raises the current level and not the voltage level. Amplifier 94 includes emitter follower transistor 96 held conductive through a base energizing path comprising voltage source 98 and resistor 100. A second emitter follower transistor 102 next receives the analog signal and is also energized by source 98. Both transistors are grounded through resistors 104. The analog signal thereafter passes through capacitor 106 to synchronous phase detector 34, which is energized by source 108.

Phase detector 34 is a standard integrated circuit, the ones presently being used are model 1496 produced by National and Motorola.

Reference line 29 bearing the high frequency pulses delivers to phase detector 34 a reference phase from the x-row 14 having an actuated key switch 20. This reference is matched to the received analog signal to discriminate actual signals from false signals and thus acts as a "high q" filter to assure delivery of the appropriate signal to encoder 22 read-only-memory. The burst of high frequency pulses received by the phase detector 34 from the multiplexer 24 combined with the reference phase from which the high frequency pulses are derived in effect combines these phases into a single pulse signal.

In effect, full wave phase detector 34 operates to phase lock the oscillatory input reference signal with the input multiplexer signal, both of which signals are alternating positive-negative. Phase detector 34 matches these signals and developes the characteristic pulse output at a level proportionate to the amplitude of the in-phase portion of the multiplexer signal.

A voltage energizing path from source 98 further provides energizing current for amplifier 112 which next receives the in-phase analog signal from phase detector 34. The signal proceeds into thresholding amplifier 114 via capacitor 116. Thresholding amplifier 114 consists of grounded emitter transistor 118 and source 120 grounded through capacitor 122. The bias of transistor 118 may be adjusted so that it will only amplify a pulse above a certain level. Capacitor 122 provides further integration or smoothing of the pulse.

The output of thresholding amplifier 114 travels through resistor 124 and continues on single line 90 to encoder read-only-memory 22A. Since the analog signal for all y-lines is transferred to encoder read-only-memory 22A by one line, it is evident that since encoder y-line scanning is in synchronization with multiplexer 24 scanning, encoder read-only-memory 22A will differentiate and pick up the appropriate analog y-line signal to be matched with the appropriate x-row line signal to provide the proper function output signal.

Thus, the foregoing has illustrated the transference of an analog signal on a single phase detector amplifier string whereby an encoder read-only-memory scanning a single line may detect a particular signal fed from a plurality of lines due to the synchronization of the encoder read-only-memory scanning and multiplexer scanning functions. It is recognized that key switch 20 and the single line string circuit signal conductor may be utilized independently of each other; however, due to the disclosed combination of a capacitive coupled key switch connection, effected partially independent of key shaft travel and its related mechanical hysterisis, the distinct high frequency pulses, and the phase detector circuit the multiplexer without amplification may easily distinguish an actuated key and the resultant multiplexer output signal may be easily identified by the synchronized encoder read-only-memory due to the signal discrimination of the phase detector more reliably than if the elements are used independently in other combinations. Specifically if the key switch of the present invention is not utilized, the single line string circuit may still be utilized provided electronic hysteresis is incorporated into the system.

The embodiment heretofore described is merely illustrative of the principles of the present invention as numerous modifications and adaptations thereof will be readily apparent to thos skilled in the art without departing from the spirit and scope thereof. The inventor wishes therefore to be limited only by the scope of the following claims.

I claim:

1. In an electronic data processing entry-system, a synchronous phase detected keyboard, comprising in combination:
    a printed circuit board whose conductors form a matrix of row coordinates and column coordinates, said row and column coordinates not physically intersecting because of discontinuities in said conductors at each possible intersection point of the matrix;
    a plurality of key switch assemblies similarly arranged in a row and column matrix configuration and able to communicate with said printed circuit board, each of said key switch assemblies having an electrically-free floating key switch coupling plate to effect capacitive coupling between a row coordinate and a column coordinate of said printed circuit board at a corresponding possible intersection point of the matrix when said key switch assembly is actuated;
    a gating means associated with said row coordinates;
    an encoder which sequentially transmits an input signal to said gating means associated with said row coordinates;
    a clock means to provide a burst of high frequency pulses which is transmitted to said gating means associated with said row conductors;
    said gating means to be turned on by said encoder signal allowing said high frequency pulses to be coupled sequentially into each of the row coordinates;
    a reference line which also carries the burst of high frequency pulses generated by said clock means in an alternate path which bypasses the keyboard matrix;
    a multiplexer which sequentially addresses each column coordinate of the matrix and receives said burst of high frequency pulses which has been coupled between a particular row coordinate and the column coordinate then being addressed, due to actuation of the appropriate key switch assembly, said multiplexer then transferring the received burst through a single output channel;
    a dividing counter means, driven by said clock means, which simultaneously drives said encoder and said multiplexer;
    a single string data transference line which receives and carries the output signal from said multiplexer;
    a current amplification means upon said single string data transference line to amplify the multiplexer output signal, a phase detection means upon said single string transference line having comparator terminals to receive from said reference line the high frequency pulses and to mix it with the amplified multiplexer output signal to distinguish false signals and generate a characteristic output voltage pulse at an amplitude proportional to the in-phase portion of the multiplexer output signal;
    a thresholding amplifier which transmits and amplifies the characteristic voltage pulse generated by said phase detection means only if it exceeds a predetermined threshold, and a read only memory, integrated with said encoder which is driven by the dividing counter means and synchronized so as to be scanning in the same sequence and at the same rate as the multiplexer, and said memory receives and recognizes the amplified characteristic output voltage pulse from said phase detection means via the thresholding amplifier and generates a unique digital code which identifies to the data processing system the particular key switch assembly which has been actuated.

2. The synchronous phase detected keyboard of claim 1 wherein the printed circuit board is an unshielded board having two sets of coordinate plates; one set of plates receiving input signals from the encoder and being the row coordinates and the other set of plates being addressed by the multiplexer and being the column coordinates, said plates being covered by a thin dielectric layer.

3. The synchronous phase detected keyboard of claim 1 further including a capacitor inserted into the single string data transference line between the threshold amplifier and the read-only-memory to smooth the amplified output voltage pulse generated by said phase detection means.

4. The synchronous phase detected keyboard of claim 1 wherein said gating means includes a plurality of AND gates, each corresponding to a particular row coordinate of the keyboard matrix, each said AND gate being inputted by both the encoder and the clock means, so that transmission through a particular row coordinate is possible only when the clock means pulse burst coincides with the encoder signal at the corresponding AND gate.

5. The synchronous phase detected keyboard of claim 1 wherein said keyswitch assembly further includes:
    an insulated integrated shaft and cap movable within an insulated key switch housing;
    an integrated key shaft platform base forming the lower extent of said shaft, the edges of said base slidably communicating with said housing;
    a magnet fixably displaced horizontally above said printed circuit board;
    support means to secure said magnet within said housing;
    an electrically free-floating coupling plate capable of providing a capacitive coupling with said printed circuit board, said coupling plate being restrained by said magnet;
    said magnet having strength to retract said coupling plate from said circuit board;
    said platform base having legs downwardly protruding from its corners, said legs being capable of extending past and below said magnet and support means to contact said coupling plate, both the platform base and the legs slidably communicating with said keyswitch housing to prevent lateral movement.

* * * * *